United States Patent [19]

Winn et al.

[11] Patent Number: 5,168,540
[45] Date of Patent: Dec. 1, 1992

[54] SCINTILLATING ARTICLES AND METHOD OF MAKING THE SAME

[75] Inventors: David R. Winn, Wilton; Peter R. Kirlin, Brookfield, both of Conn.

[73] Assignee: Advanced Technology Materials Inc., Danbury, Conn.

[21] Appl. No.: 692,138

[22] Filed: Apr. 26, 1991

Related U.S. Application Data

[63] Continuation-in-part of Ser. No. 581,631, Sep. 12, 1990.

[51] Int. Cl.$^5$ .............................................. G02B 6/22
[52] U.S. Cl. .................................. 385/128; 385/141; 385/144; 427/69
[58] Field of Search .................... 350/96.29–96.34; 385/123–130, 141, 142, 144; 427/64–73

[56] References Cited

U.S. PATENT DOCUMENTS

| | | | |
|---|---|---|---|
| 4,552,431 | 11/1985 | Allemand et al. | 350/96.34 |
| 4,586,785 | 5/1986 | Swinehart | 350/96.34 X |
| 4,626,068 | 12/1986 | Caldwell | 350/96.34 |
| 4,788,436 | 11/1988 | Koechner | 350/96.34 X |
| 4,812,013 | 3/1989 | Aurouet et al. | 350/96.29 |
| 4,828,354 | 5/1989 | Yoshida | 350/96.34 |
| 4,940,603 | 7/1990 | Soltani | 427/66 |

OTHER PUBLICATIONS

Winn, D. R., et al., "Thin Films of Barium Fluoride Scintillator Deposited by Chemical Vapor Deposition", Nuclear Instruments and Methods in Physics Research A 289 (1990) 261–264, North-Holland.

Primary Examiner—John D. Lee
Attorney, Agent, or Firm—Steven J. Hultquist

[57] ABSTRACT

A scintillating article comprising a substrate coated with an inorganic scintillating material comprising a doped or undoped material selected from the group consissting of barium fluoride, calcium fluoride, zinc oxide, zinc sulfide, zinc silicate, bismuth germanate, fast cathode ray tube phosphors, yttrium silicate, rare earth silicates, orthosilicates, and mixtures thereof. Also disclosed is an appertaining method of forming such a scintillating article, comprising depositing the inorganic scintillating material by chemical vapor deposition (CVD). In a particularly advantageous embodiment, the substrate is of fibrous form, e.g., a quartz optical quality fiber, which is coated with a scintillating material such as barium fluoride. The scintillating articles of the invention are usefully employed as detectors for ionizing particles in high energy physics applications, such as radiation track imaging and tracking chambers, calorimetry, synchrotron radiation electron detectors, and pixel detectors for active targets, as well as detector elements and high energy particle accelerators and other high rate systems.

20 Claims, 3 Drawing Sheets

SCINTILLATING ARTICLES AND METHOD OF MAKING THE SAME

CROSS-REFERENCE TO RELATED APPLICATION

This is a continuation-in-part of U.S. application No. 07/581,631 filed Sep. 12, 1990 in the names of Peter S. Kirlin, et al for "SOURCE REAGENT COMPOUNDS FOR MOCVD OF REFRACTORY FILMS CONTAINING GROUP IIA ELEMENTS".

BACKGROUND OF THE INVENTION

1. Field of The Invention

The present invention relates to scintillating articles and methods of forming same, and more particularly in a preferred embodiment to a scintillating article comprising a barium fluoride film is deposited on an optical waveguide.

2. Description of the Related Art

Scintillating optical fibers are useful as detectors for ionizing particles in high energy physics applications such as radiation track imaging and tracking chambers, calorimetry, synchrotron radiation electron detectors, and pixel detectors for active targets. These fibers can be adapted for use as detector elements in high energy particle accelerators and other high rate experiments.

Current scintillating fibers are drawn from boules of scintillating materials down to sub-millimeter sizes. The scintillation light is captured by total internal reflection and piped out to pixel detectors. The light yields for energy deposited by minimum ionizing particles are 1-2 photons/KeV for cerium oxide glasses and 2-10 photons/KeV for plastic scintillators, the two most common fiber scintillators. By comparison, the crystalline salt NaI yields 40 photons/KeV with a 230 nanoseconds (ns) decay. However, most large crystalline scintillators cannot be drawn into fibers.

The plastic scintillating fibers have excellent scintillation decay temporal properties (1-2 ns decay times) but produce only a few captured optical photons in a few hundred micron thick scintillating optical fiber traversed by a minimum ionizing particle. The fibers therefore require a very high gain pixel detector for good signal-to-noise ratios and also for high bandwidth. Furthermore, these plastic scintillating fibers suffer radiation damage at relatively low doses compared with the potential doses for use in high energy accelerators, and can suffer from other environmental effects such as crazing or water absorption. Although progress has been made in improving the environmental properties of plastics, few long-term tests under realistic radiation exposures have been reported. Furthermore, very long plastic scintillating optical fibers are not useful because of optical self-absorption.

On the other hand, some scintillating glasses, for example, cerium oxides, can be made very radiation-hard. However, scintillating glasses have an even lower low-light output, usually lower than that of plastic scintillators, and also have much longer scintillation decay times (~10–50 ns), both of which are undesirable in many high energy applications. Scintillating glasses are also more expensive than plastic.

It is therefore an object of the current invention to provide a scintillating article with (a) very high specific light output, (b) potential radiation-hardness, (c) long-term environmental stability, (d) high dE/dx character and short radiation length compared to plastic, (e) low cost compared to some glasses, (f) high scintillation speed compared to glass fibers, and (g) potentially long attenuation lengths of the emitted light per unit photon output, especially compared with plastic scintillator fibers. It is a further object of the present invention to provide a method for efficient production of these scintillating articles.

Using the scintillating articles of the present invention, a set of imaging radiation detectors can be prepared whose properties can be adjusted for the task at hand. These scintillating optical articles, e.g., scintillating fibers, can be used in medical imaging and diagnostic tools, in industrial non-destructive testing, in industrial x-ray or UV sensors and actuators, in space research, in reactor and nuclear industry monitoring, and in nuclear effects and weapons testing, as well as in high energy physics research.

A grid of properly arranged luminescent fibers according to the present invention can detect the projection of shapes when illuminated by ionizing radiation. Pattern recognition techniques can be easily employed with specific flexible fiber topologies detected by pixel devices. Fibers of such type can also be bundled for extra stopping power, redundancy, or for energy/range discrimination in an x-ray detector.

The scintillating articles of the present invention may be used in image intensifiers, or other vacuum photocathode optical imaging sensors. A fine two-dimensional grid of phosphor fibers according to the invention arranged transversely to the photoelectron image, can replace the conventional phosphor screen anode, sampling the image in x-y projections, with the fibers being "read out" conventionally as x-y image information. In high-energy physics, large detectors of this type can be used in RICH detectors.

SUMMARY OF THE INVENTION

The present invention relates in one aspect to scintillating articles comprising films of organic scintillators on suitable optical substrates, which may be usefully employed, for example, for detecting ionizing radiation.

The invention relates in another aspect to a method for coating inorganic scintillators onto suitable optical substrates, to form scintillating articles useful for detecting ionizing radiation.

Scintillating articles with temporal, scintillation, radiation-hardness and material properties may be prepared by coating thin, mechanically robust optical substrates, e.g., optical fiber armatures or optical fiber substrates, with inorganic scintillator films. These luminescent materials, and optionally protective cladding materials as well, can be deposited onto the substrates using chemical vapor deposition (CVD) techniques. Scintillator articles thereby may be prepared which take advantage of the properties of well-known inorganic scintillators with high light output, radiation strength, and high speed.

The inorganic scintillator may advantageously be selected from the group consisting of barium fluoride, calcium fluoride, zinc sulfide, fast cathode ray tube (CRT) phosphors, bismuth germanate, and mixtures thereof. The scintillator may be undoped, or alternatively may be doped by metals such as europium, gallium or silver. The substrate is appropriately formed of a high transparency optical glass, quartz, silicon, or other suitable material, and the substrate preferably is in the form of a fiber.

Other aspects and features of the present invention will be more fully apparent from the ensuing disclosure and appended claims.

DETAILED DESCRIPTION OF THE INVENTION

Figure 1:
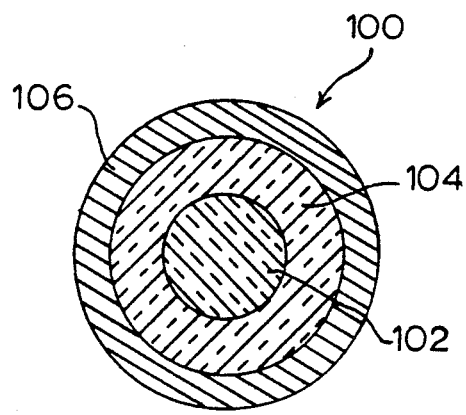
FIG. 1 shows a cross-section of a layered scintillating fiber according to one embodiment of the invention.

The scintillating articles of the present invention comprise substrates coated with inorganic scintillating materials.

While the invention is described hereinafter primarily in application to a scintillating article comprising a substrate of fiber of filament form, it will be recognized that the substrate may take any suitable form, shape, or configuration, as suitable for the specific end use application intended for the scintillating article. Accordingly, it will be recognized that description of the substrate as being of fibrous or filamentous form, while representing a preferred substrate element conformation, is of an illustrative character, and that the substrate may within the broad practice of the present invention assume or be provided in other forms.

The UV-visible scintillators useful for the substrate coating are selected from a group of inorganic salts that are compatible with CVD processing and with the lattice and bond-lengths of the substrates and that have good scintillation properties. Potentially useful scintillators for the coating include zinc oxide, gallium- and/or silver-doped zinc oxide, zinc sulfide, silver-doped zinc sulfide, calcium fluoride, europium-doped calcium fluoride, barium fluoride lanthanum-doped barium fluoride, and bismuth germanate (BGO). The relevant properties of some of these materials are set out in Table I below, wherein $I_p$ is the emitted wavelength, in nanometers, and $t_p$ is the decay constant, in nanoseconds (with dopant species, when used, being identified parenthetically after the chemical formula of the film material):

TABLE I

| Material | Density | Refractive Index | Photons/ keV | $I_p$(nm) | $t_p$(ns) |
|---|---|---|---|---|---|
| ZnO(Ga) | 5.61 | 2.02 | 16 | 385 | 0.4 |
| ZnS(Ag) | 4.09 | 2.36 | 52 | 450 | 200 |
| CaF$_2$(Eu) | 3.17 | 1.44 | 19 | 435 | 1000 |
| BaF$_2$ | 4.88 | 1.51 | 12 | 220 | 0.6 |
|  |  | 1.49 |  | 310 | 620 |
| BGO | 7.13 | 2.15 | 8 | 480 | 300 |

Additionally, zinc and yttrium silicates, cathode ray tube (CRT) phosphors (P41, P47, P16), and other rare earth silicates and orthosilicates are excellent scintillators, with light yields and speeds exceeding the crystalline scintillator, thallium-doped sodium iodide, NaI(Tl). Many of the very best scintillators, though unavailable in single crystals, are ideal for the thin scintillator films utilized the practice of the present invention. All of the above materials are radiation-hard; many far exceed the expected doses for the most rigorous conditions expected in high energy physics experiments. In addition, the properties of the scintillators may be modified by doping. For example, the slow component of BaF$_2$ scintillation may be suppressed by doping with lanthanum or other suitable dopant species.

BaF$_2$ films grown on UV-transmitting quartz fibers have been employed to form scintillating fiber articles which are particularly advantageous, for the following reasons: (a) the ease of BaF$_2$ CVD deposition; (b) the very high optical surface quality achievable for BaF$_2$ films; (c) the well-characterized radiation hardness of BaF$_2$; and (d) the very high-speed scintillation of BaF$_2$, especially with long component suppression by dopants. Higher light outputs are potentially available from other inorganic scintillating materials.

Inorganic scintillators have a scintillator efficiency typically 2-4 times that of plastic scintillators and a high specific ionization, dE/dx, which is 2-3 times that of plastics. Thus, ~5-10 times higher light yield may be obtained from an inorganic scintillating fiber compared to a plastic fiber of corresponding cross-section, provided that optical waveguiding and absorption can be controlled to similar levels. Single crystal BaF$_2$ is an ideal material for the construction of multipurpose phonon-detectors. Scintillation counters built from such single crystals have excellent timing, high counting rates, good energy resolution, and are insensitive to neutrons and resistant to radiation damage [H. J. Korner, "Detection of Photons with BaF$_2$ Scintillators," *Bull. Amer. Phys. Sci.*, 33, 1091, 1988]. High-quality BaF$_2$ luminescent coatings can be deposited on fiber or other substrates with readily controllable dimensional properties.

The thin films of inorganic scintillator can be deposited by any suitable deposition method, but CVD is particularly preferred as a controlled decomposition method for laying down a thin film coating. As used herein, the term "thin film" used in application to the scintillator coatings employed in the broad practice of the present invention, means a coating of such type having a thickness of less than 100 micrometers ($\mu$m), preferably less than 10$\mu$m, and most preferably below 1.0$\mu$m. A highly advantageous range of film thickness values which may be usefully employed in the practice of the invention is a scintillator coating film thickness of from about 0.05 $\mu$m to about 10 $\mu$m, and more preferably from about 0.1 $\mu$m to about 5 $\mu$m. In CVD methods, molecules containing the desired element or elements are volatized and transported into the CVD reactor in the gaseous state. Energy is added to the molecule and it decomposes to leave the desired element(s) as a thin film. The coatings formed by CVD may be metals, oxides, or semiconductors. The coatings may be single elements such as silicon, or chemical compounds such as gallium arsenide. The reagents that react to form the coatings can be any of a variety of chemica types. Their key characteristics are volatility (so that they can be carried into the reactor in the gaseous state), and the ability to undergo chemical reaction to form the desired coating.

Because the coating process occurs from a gaseous state, CVD is able to coat a wide variety of surface shapes with no "line-of-sight" or shadow effects. The process can be fine-tuned by modulating the process variables: pressures and temperatures of the reagents, temperature of the surface to be coated; chemical nature of the reagents; flow rate through the reactor; etc. Under selected process and source reagent conditions, a coating that keeps the crystal structure of the substrate may be formed (i.e., an "epitaxial" coating). CVD can readily be scaled-up to commercial manufacturing scale and can be used in continuous processes to coat multifilament bundles.

Various luminescent thin film techniques have been reviewed by P. Goldberg and others [P. Goldberg, "Luminescent Thin Films," in *Luminescence of Inorganic Solids*, P. Goldberg, ed., Academic Press (1966); Proceedings of a symposium entitled "Preparation and Characteristics of Solid Luminescent Materials", J. Wiley, *(1948)*; *Proc. Int. Conf. on Luminescence*, North-Holland, 1970)], and thin luminescent films have been prepared by CVD under cathode ray bombardment.

Substrates which are particularly useful in the practice of the present invention include those which are available at a low cost, and which are characterized by a good match of lattice parameter and index of refraction with the scintillator overcoat, a sufficiently high melting point so that interdiffusion between the substrate and the coating does not occur during the coating deposition process, and low optical dispersion and low attenuation of light at the wavelength emitted by the scintillator.

Substrate materials which are potentially useful in the broad practice of the present invention include silica (e.g., quartz), zinc selenide, spinel, aluminum oxy nitride, gallium arsenide, germanium, gallium aluminum arsenide, fluoride-doped fused silica, silicon, sapphire, and various silicate glasses of optical quality. Particularly preferred substrate single crystalline or glass fiber materials that have close lattice, chemical, and thermal compatibility with the scintillating materials that are coated thereon. The substrate is suitably formed of a glass or single crystal material, polycrystalline material is generally not usefully employed.

$SiO_2$ is a potentially useful substrate material that is available in fiber form at low cost. In addition, the lattice match between the pseudo-lattice constant of $SiO_2$ (quartz) (a=5.4 Å) and thin $BaF_2$ film (a=6.20 Å) is good. $BaF_2$ (Tm=1355° C.), $CaF_2$ (Tm=1423° C.) and $SiO_2$ (Tm=1665° C.) have extremely high melting points, and thus reaction and/or interdiffusion during deposition is minimal. The lack of long range order in the glassy substrate promotes the formation of polycrystalline films. Alternatively single crystal Si (a=5.4, Tm=1413° C.) may usefully be employed as a substrate material to achieve single crystal $BaF_2$ films.

Low optical dispersion and low attenuation light guiding have been widely demonstrated with quartz fibers. For example, even at the 220 nm emission band of $BaF_2$, quartz optical fibers are available with a 90% transmission per meter of length. Quartz fibers are readily commercially available (e.g., from Mitsubishi Cable Company Limited with a transmission of 90%/meter at 220 nm and 98%/meter at 310 nm, where $BaF_2$ emits. Light-piping can occur at the $BaF_2$-air interface, or at a $BaF_2$ secondary cladding interface. In an unclad fiber, the total internal reflection interface occurs at the air-scintillator interface; claddings can be added as needed. Since quartz has a higher index of refraction than $BaF_2$ or $CaF_2$, substantial fractions of the light paths can be in the quartz substrate when these fluorides are used as the scintillator coating material.

Inorganic scintillator-coated fibers may be prepared by batch CVD processes, or in continuous fiber-coating processes whereby fiber is passed through the CVD furnace continuously. The films can be grown in standard CVD reactors that are modified to provide a heated manifold and injection zone that allows uniform thin films to be grown from the scintillator source reagents, which typically are relatively involatile but chemically reactive compounds. Appropriate methods are described in U.S. Pat. application No. 07/581,631 filed Sep. 12, 1990, of which this application is a continuation-in-part, and the disclosure of which hereby is incorporated herein by reference. If the scintillator is sought to be doped, a source reagent to deliver the dopant is advantageously included in the CVD process at an appropriate concentration. Such "in situ" doping is one of the especially useful capabilities of the CVD process in preparing the scintillating fiber articles of the present invention.

By way of example, quartz fibers have been coated by CVD with $BaF_2$ films as thin as 0.5 microns and as thick as 40 microns by standard thermal and plasma-assisted CVD techniques familiar to those skilled in the art. The barium source reagents are preferably acetylacetonate complexes, such as barium bis(hexafluroacetylacetonate), barium bis(1,1,1,5,5,5-hexafluoro-2,4-pentanedionate), or most preferably, barium bis(1,1,1,2,2,2,3,3,3-heptafluoro-7,7-dimethyl-4,6-octanedionate), abbreviated Ba(fod)$_2$. The $BaF_2$ coating may be doped with lanthanum by including the lanthanum source reagent La(fod)$_3$ or lanthanum tris (2,2,6,6-tetramethyl-3,5-heptanedionate), abbreviated La(thd)$_3$, in the process gas stream.

In general, the substrate may consist of any suitable material, preferably of high optical quality, and may be utilized in any appropriate shape, configuration, or form for the intended use of the scintillating article in which the substrate element is employed. Thus, the substrate element may be planar, curvate, or other suitable shape. In a particularly preferred aspect, the substrate element is a fiber or filament, preferably formed of an optical character material of suitable composition for scintillation usage. For light piping and other scintillating fiber applications, the fiber or filament substrate may advantageously have a diameter of from about 0.5 to about 200 $\mu$m, more from about 1.0 to about 25 $\mu$m, and most preferably on the order of from about 2 to about 15 $\mu$m.

In some applications, it may be desirable to utilize the scintillating coating on a composite substrate, such as a multilayer material, such as a thin silica film, e.g., of 20-200 Angstroms thickness, on a silicon or other base layer, and the term "substrate" and "substrate element" as used herein are intended to be broadly construed to encompass such composite, e.g., multilayer, structures.

Shown in FIG. 1 is a cross-section of a scintillating fiber article according to one embodiment of the present invention. The scintillating fiber article 100, which comprises a core fiber substrate 102, which may for example be formed of optical quality fused silica (silicon dioxide). Coated on the core fiber 102 by chemical vapor deposition or other suitable coating method, is a layer 104 of a scintillating material such as barium fluoride or calcium fluoride, optionally doped with lanthanum or other suitable dopant species. Exteriorly coated on the scintillating film 104 is an optional cladding layer 106, which may be of any suitable material which does not preclude the efficacy of the scintillating fiber for its intended purpose. The cladding layer may likewise be deposited by chemical vapor deposition or any other suitable methods.

Figure 2:
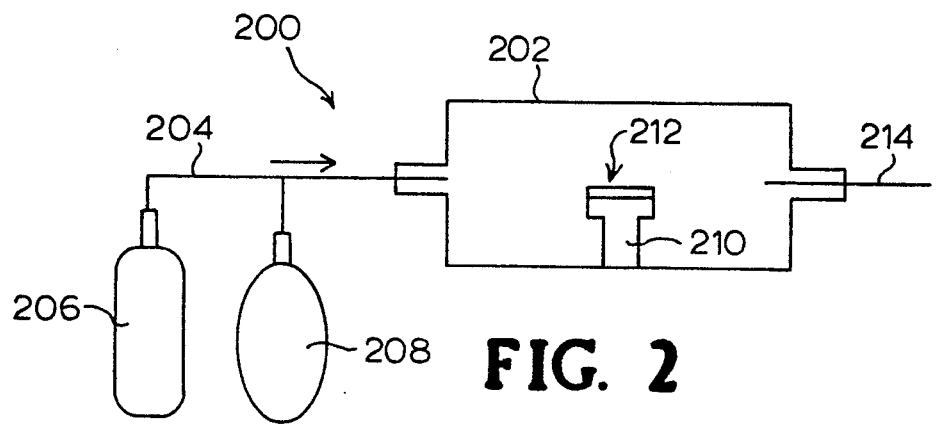
FIG. 2 is schematic diagram of a chemical vapor deposition apparatus for depositing an inorganic scintillator overlayer onto a substrate fiber substrate.

FIG. 2 is a schematic representation of a chemical vapor deposition process system 200 which may be usefully employed to deposit a scintillating material layer on a substrate, in accordance with the present invention.

The process system 200 comprises a CVD reactor 202 which is joined by means of manifold 204 to a carrier gas supply means 206, which may comprise helium, argon, or other carrier gas, in a suitable pressurized container. Also joined to manifold 204 is source reagent supply vessel 208, which may for example contain a barium hexafluoroacetylacetonate precursor compound for forming a barium fluoride film on the substrate article, and which is carried to the CVD reactor 202 in manifold 204 after mixing with the carrier gas therein, as supplied from carrier gas source means 206.

In the CVD reactor 202, a platform (susceptor 210 is selectively mounted with respect to the gas flow direction through the reactor, for mounting of a substrate element 212. The susceptor and substrate element are suitably heated (by means not shown) to elevated temperature sufficient to decompose the source reagent and to deposit barium fluoride or other suitable scintillating film material on the substrate element 212. After contacting the substrate element 212, the CVD source gas reagent mixture is discharged from the reactor in discharge line 214.

The features and advantages of the present invention are more fully shown by the following non-limiting examples.

EXAMPLE I

Preparation of BaF$_2$-Coated Quartz Fibers

Thin quartz tube fiber prototypes (600 $\mu$OD×3 cm long) were coated with BaF$_2$ in a planar substrate CVD reactor by cantilevering the quartz fiber tubes over the edge of the substrate holder. These fibers were glued over ~1-2% of their length with TiB$_2$ to the edge of a Si wafer standoff which rested on the SiC susceptor, heated by an infrared lamp. BaF$_2$ films as thin as 0.5 micrometers and as thick as 40 micrometers were grown by standard thermal and plasma assisted CVD. The BaF$_2$ films exhibited columnar growth which is extremely poor for light guiding along the fiber axis, but adequate for a planar pixel radiation detector. The lack of long range order in the films is most likely a consequence of the glassy, rather than crystalline, structure of the quartz fiber substrate which served as a nucleation template for the BaF$_2$ film.

EXAMPLE II

Preparation of BaF$_2$-Coated Quartz/Silicon Substrate Article

Utilizing a CVD reactor system of the type shown schematically in FIG. 2 hereof, thin BaF$_2$ films were grown, utilizing a heated manifold and injection zone which allowed uniform thin films to be grown from relatively involatile but chemically reactive source reagents.

The MOCVD barium source reagent was synthesized free of instability producing contaminants, in accordance with the procedure of G. S. Hammond et al, *Inorg. Chem.* 2 (1973) 73. Trace organic impurities were removed by a vacuum sublimation process. The efficacy of these procedures was verified by inductively coupled plasma atomic emission spectroscopy (trace metal impurities) and gas chromatography/mass spectrometry (trace organic impurities).

Figure 3:
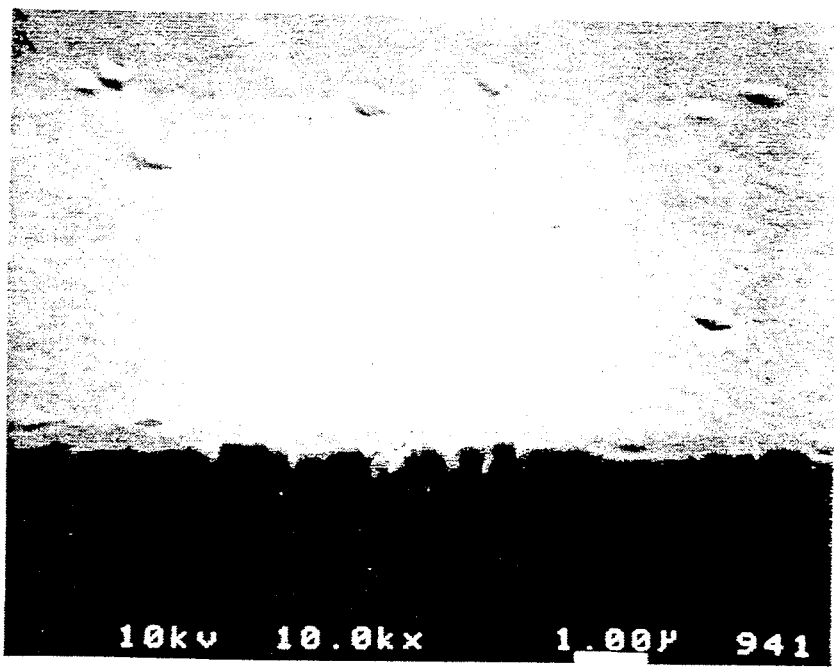
FIG. 3 is an electron micrograph of a CVD barium fluoride film on a fixed substrate.

BaF$_2$ films approaching epitaxial quality were deposited by MOCVD. The best morphologies were achieved at high temperatures and low pressures. Higher growth temperatures may improve the morphology of the epitaxial films, however, reaction conditions that promote interdiffusion between BaF$_2$ and the quartz substrate must be avoided. A BaF$_2$ thin film, of 0.7 $\mu$m thickness, approximately 1 centimeter×1 centimeter in area, was deposited on a compound substrate comprising a 50 Angstrom thick silica layer on a silicon wafer base. A scanning electron micrograph (SEN) is shown in FIG. 3, and suggests that the BaF$_2$ thin film is nearly a single crystal. Columnar growth, pinholes, particulates, dimensional tolerants and gross discontinuities in the BaF$_2$ layer are absent, implying an excellent processing history. The surface morphology is smooth (relative to the wavelength of UV light which is indicative of good optical performance.

EXAMPLE III

Scintillation Results of Example II BaF$_2$ Film

Figure 4:
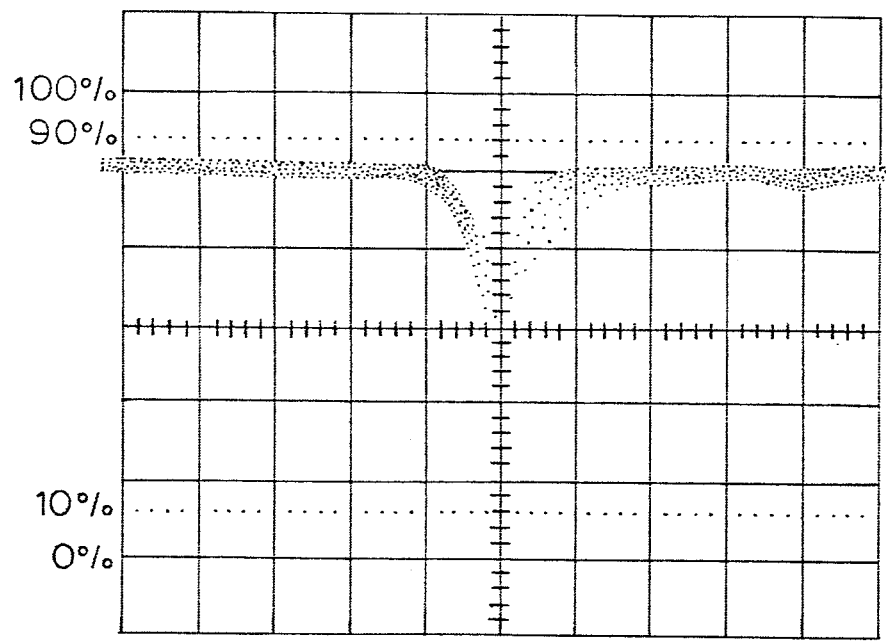
FIG. 4 is an oscilloscope output from a photomultiplier coupled to a CVD barium fluoride thin film, illuminated by $^{55}$Fe X-rays.
Figure 5:
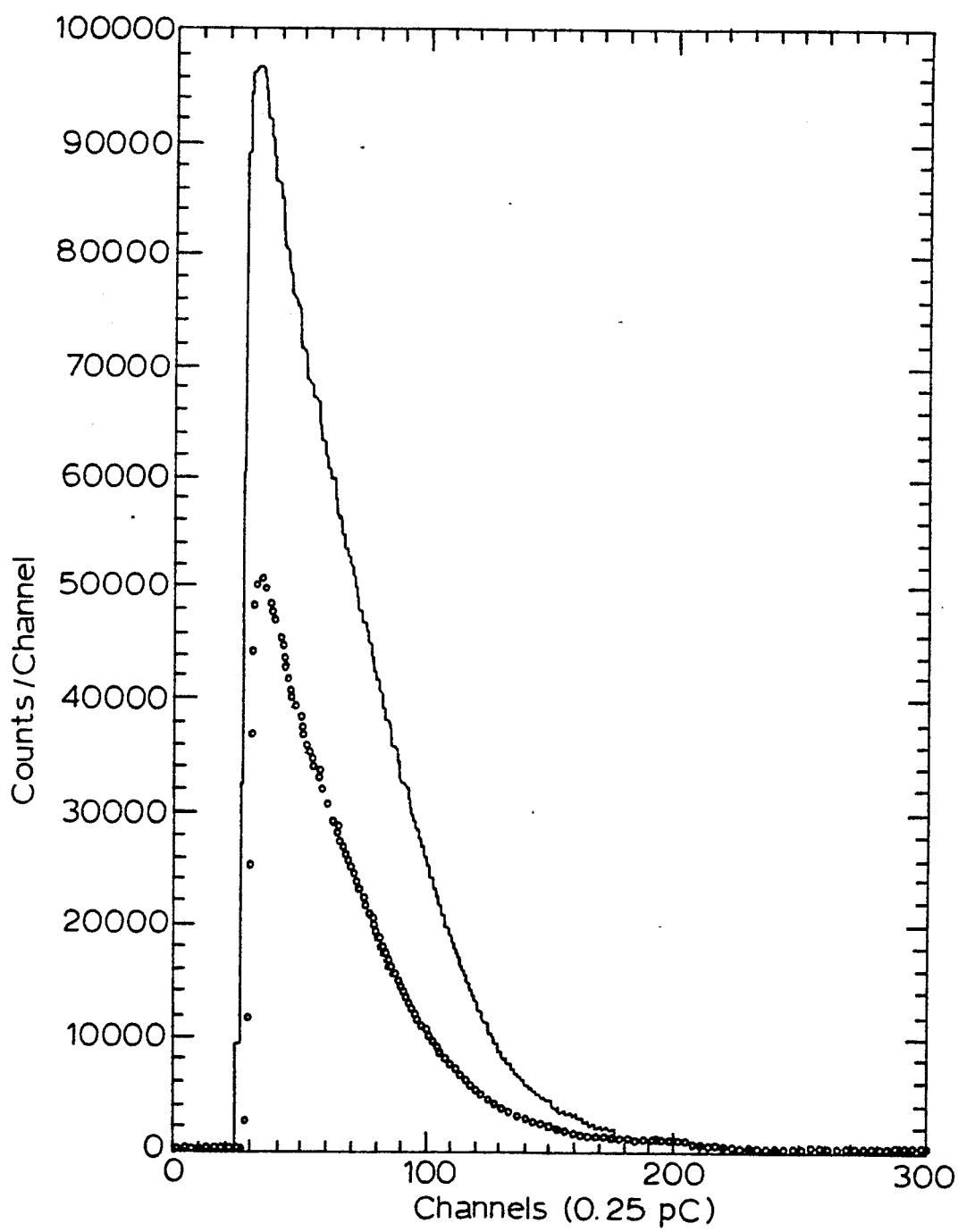
FIG. 5 is a grah of pulse-height spectra of $^{55}$Fe X-rays on a barium fluoride thin film (line), together with an $^{55}$Fe no-film background taken from the same time intervals.

The planar thin BaF$_2$ film article of Example II was coupled to a high gain (5×10$^6$), low noise, 12 mm diameter UV photomultiplier tube using silicone optical grease. The film was back-illuminated by a 0.8 $\mu$m Ci $^{55}$Fe X-ray source (~6 KeB), giving usable photoelectric absorption with negligible Compton or Cherenkov background in the very thin film. Fast scintillation pulses were evident in the oscilloscope traces, which are shown in FIG. 4. The pulse-height spectra was measured using a CAMAC system with a 0.25 pC least count charge ADC, a gain of 10 preamp, and triggered by a threshold discriminator (~0.5 photoelectrons) on the phototube pulse (no shaping, 250 ns gate). The average pulse height (see FIG. 5) above background for the 0.7 $\mu$m thick barium fluoride film illuminated by $^{55}$Fe X-rays is about 1.5±0.9 photoelectrons. The photoelectron level was determined by a Green LED light pulser statistical method using the width of a pulse-height distribution, with the same gate width as the data, and consistent with a second method, lowering the intensity of a triggered light source until the pulse-height spectra became independent of the rate.

The average pulse height was roughly consistent with the scintillation efficiency properties of high-quality barium fluoride single crystals. The 5.9 KeV$^{55}$ Fe gamma ray with perfect photoelectric absorption would create about 60-65 photons in crystalline barium fluoride of high quality. The net collection efficiency wa estimated at ~30-40%, including geometrical and the phototube window. About 55% of the total photons are lost because of the gate width, compared with the 620 ns decay constant of the longer wavelength ultraviolet scintillation light component (about 8% of the light). A 15-20% photomultiplier quantum efficiency would therefore produce about 1.2-2.3 photoelectrons, consistent with the measurement made in this example.

Background was carefully checked in the same conditions with the $^{55}$Fe source in place, but with the scintillator film replaced by an uncoated substrate, to remove any residual effect on the pulse-height spectra from the photomultiplier or other material responses to the low-energy X-rays. The source-on background spectra was consistent with no-source dark noise. The half-photoelectron threshold counting rate was about 2.5 times higher than background, roughly consistent with the source strength and the thin film stopping power.

Crystalline scintillator-coated optical substrates can be used in vacuum and in high-radiation environments. Standard photolithographic techniques and batch processing could be used to fabricate scintillating pixels matched to (or even fabricated into) pixel optical detectors. Scintillator detectors with optimal properties could be fabricated by changing the scintillator type, scintillator thickness, and substrate geometry, all within the scope of the present invention. Film thicknesses on the order of 50–100 μm and areal extents up to thousands of $cm_2$ are potentially fabricatable in the practice of the present invention.

In the operation of a system such as shown in FIG. 2 in a continuous fashion, substrate elements in the form of fibers, filaments, or fine wire may be utilized in which a fiber-winder tensions and holds a flexible fiber tow through the reactor, heating the fiber substrates sufficiently to cause film growth, thereby achieving continuous formation of the scintillating film on the substrate fiber element.

While the invention has been illustrative described herein with reference to specific embodiments and features, it will be appreciated that various alternatives, modifications, and other embodiments exist, and that all such variations, modifications, and alternative embodiments are to be regarded as being within the spirit and scope of the invention.

What is claimed is:

1. A scintillating article, comprising a substrate having coated thereon a thin film consisting essentially of a doped or undoped inorganic scintillating material selected from the group consisting of zinc silicate, yttrium silicate, rate earth silices, orthosilacates, and mixtures thereof, said inorganic scintillating material thin film (i) having a thickness of less than 100 micrometers and (ii) being devoid of any metal film coated thereon.

2. An article according to claim 1, wherein the substrate comprises a material selected form the group consisting of silica, silicon, zinc selenide, spinel, aluminum oxy nitride, gallium arsenide, gallium aluminum arsenide, germanium, sapphire, and silicate glass.

3. A article according to claim 1, wherein the inorganic scintillating material thin film is an epitaxial film of substantially single crystal character.

4. An article according to claim 1, wherein the substrate comprises a silicate glass optical fiber.

5. An article according to claim 1, wherein the inorganic scintillating material is doped with a metal dopant.

6. An article according to claim 5, wherein the metal dopant is selected from the group consisting of europium, gallium, silver, and mixtures thereof.

7. An article according to claim 1, wherein the substrate comprises an optical quality fiber.

8. An article according to claim 1, wherein the inorganic scintillating material is coated on the substrate at a thickness of from about 0.05 up to 100 μm.

9. A scintillating article comprising a substrate having coated thereon a thin film consisting essentially of an inorganic scintillating material selected from the group consisting of barium fluoride, calcium fluoride, zinc oxide, zine sulfide, zinc silicate, bismuth emanate, fast cathode ray tube phosphors, yttrium silicate, rare earth silicates, orthosilicates, and mixtures thereof, said inorganic scintillating material thin film being doped with a metal dopant.

10. An article according o claim 9, wherein the inorganic scintillating material is barium fluoride.

11. An article according to claim 9, wherein the metal dopant is selected from the group consisting of europium, gallium, silver, and mixtures thereof.

12. An article according to claim 9, wherein the inorganic scintillating material is coated on the substrate at a thickness of from about 0.05 to about 100 μm.

13. An article according to claim 9, wherein the inorganic scintillating material has a thickness below 1.0 micrometer.

14. An article according to claim 9 wherein the substrate is formed of optical quality glass.

15. A method for forming on a substrate a scintillating layer consisting essentially of a doped or undoped inorganic scintillator material selected from the group consisting of barium fluoride, calcium fluoride, zinc oxide, zinc sulfide, zinc silicate, bismuth germanate, yttrium silicate, rare earth silicates, orthosilicates, and mixtures thereof, including the steps of depositing the inorganic scintillator material by chemical vapor deposition and doping he inorganic scintillator material with a metal dopant.

16. A method according to claim 15, wherein the scintillating layer has a thickness of from about 0.05 to about 100 μm.

17. A method according to claim 15, wherein the substrate comprises a fiber element.

18. A method according to claim 15, wherein he inorganic scintillator material comprises barium fluoride.

19. A method according to claim 15, wherein the substrate comprises an optical quality glass fiber.

20. A method according to claim 15, wherein the metal dopant is selected form the group consisting of europium, gallium, silver, and mixtures thereof.

* * * * *

UNITED STATES PATENT AND TRADEMARK OFFICE
CERTIFICATE OF CORRECTION

PATENT NO. : 5,168,540
DATED : December 1, 1992
INVENTOR(S) : Winn, et al

It is certified that error appears in the above-identified patent and that said Letters Patent is hereby corrected as shown below:

In the Abstract: line 4, change "consissting" to --consisting--.
Column 3, line 16, change "grah" to --graph--.
Column 4, line 60, change "chemica" to --chemical--.
Column 8, line 10, after "approximately" change "1" to --1--.
Column 9, line 38, change "rate earth silices" to
--rare earth silicates--.
Column 10, line 13, change "zine sulfide" to --zinc sulfide--.
Column 9, line 38, change "orthosilacates" to --orthosilicates--.
Column 10, line 13, change "bismuth emanate" to --bismuth germanate--
Column 10, line 18, change "according o" to --according to--.
Column 19, line 39, claim 15 change "he" to --the--.
Column 10, line 52, claim 20 change "form" to --from--.

Signed and Sealed this

Eighteenth Day of January, 1994

Attest:

BRUCE LEHMAN

Attesting Officer                Commissioner of Patents and Trademarks